United States Patent
Ojika et al.

(10) Patent No.: US 11,387,816 B2
(45) Date of Patent: Jul. 12, 2022

(54) POWER CONTROLLER

(71) Applicant: Mitsubishi Electric Corporation, Tokyo (JP)

(72) Inventors: Satoshi Ojika, Tokyo (JP); Shinichiro Oikawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/417,115

(22) PCT Filed: Jan. 31, 2019

(86) PCT No.: PCT/JP2019/003283
§ 371 (c)(1),
(2) Date: Jun. 22, 2021

(87) PCT Pub. No.: WO2020/157884
PCT Pub. Date: Aug. 6, 2020

(65) Prior Publication Data
US 2022/0077846 A1 Mar. 10, 2022

(51) Int. Cl.
H02J 1/10 (2006.01)
H03K 3/037 (2006.01)
H03K 5/24 (2006.01)

(52) U.S. Cl.
CPC .............. H03K 3/037 (2013.01); H03K 5/24 (2013.01)

(58) Field of Classification Search
CPC ..... H02J 1/10; H02J 1/102; H02J 7/35; Y02E 60/12; G06F 1/26
(Continued)

(56) References Cited

U.S. PATENT DOCUMENTS

| 5,814,903 A * | 9/1998 | Wu | H02J 1/108 307/125 |
|---|---|---|---|
| 6,181,115 B1 * | 1/2001 | Perol | H01M 10/44 323/234 |
| 2020/0280184 A1 * | 9/2020 | Ojika | B64G 1/428 |

FOREIGN PATENT DOCUMENTS

| JP | 2009-225576 A | 10/2009 |
| JP | 2013-255399 A | 12/2013 |

(Continued)

OTHER PUBLICATIONS

International Search Report and Written Opinion dated Apr. 23, 2019, received for PCT Application PCT/JP2019/003283, Filed on Jan. 31, 2019, 12 pages including English Translation.

(Continued)

Primary Examiner — Quan Tra
(74) Attorney, Agent, or Firm — Xsensus LLP

(57) ABSTRACT

An operation processing unit computes an amount of operation for adjusting electric power supplied to a load. A signal generator computes, based on an amount of operation, the number of switch elements to be turned on among switch elements and a duty ratio to be set for the number of switch elements to be turned on and generates, based on the determined number of switch elements and duty ratio, a signal for driving at least one of the switch elements. The signal generator includes a correction value operation unit that obtains a correction value based on a difference of an on-pulse width between a shunt current flowing through a corresponding one of the switch elements and a shunt drive signal for driving the corresponding one switch element, and a corrector that corrects, based on the correction value, an amount of operation output from the operation processing unit.

15 Claims, 13 Drawing Sheets

(58) Field of Classification Search
USPC .......................................................... 307/43
See application file for complete search history.

(56) References Cited

FOREIGN PATENT DOCUMENTS

| JP | 2014-71554 A | 4/2014 |
|---|---|---|
| JP | 2015-89242 A | 5/2015 |
| WO | 2017/145362 A1 | 8/2017 |

OTHER PUBLICATIONS

Ojika et al., "Distributed Heat Generation and High Response Control of Satellite Power Bus Voltage Regulator", IEICE, 2016, 3 pages including English Translation of entire text (except drawings).

Ojika et al., "Bus Voltage Controller for Satellite", Mitsubishi Denki Giho, vol. 91, No. 7, 2017, 9 pages including English Translation of entire text (except drawings).

Notice of Reasons for Refusal dated Sep. 17, 2019, received for JP Application 2019-528928, 12 pages including English Translation.

\* cited by examiner

POWER CONTROLLER

CROSS-REFERENCE TO RELATED APPLICATION

The present application is based on PCT filing PCT/JP2019/003283, filed Jan. 31, 2019, the entire contents of which are incorporated herein by reference.

TECHNICAL FIELD

The present invention relates to a power controller.

BACKGROUND ART

A power controller is used to control an amount of electric power supplied to a load. For example, a satellite uses a power controller as a bus power supply to supply a stabilized voltage of about 50 V or 100 V to its device. For example, a power controller for a satellite supplies a load with electric power generated by multiple photovoltaic arrays during daylight hours and also short-circuits (hereinbelow, also referred to as shunts) an output from a particular photovoltaic array, thereby suppressing an increase in the voltage of the power bus.

In such a power controller, the number of stages of photovoltaic arrays depends on the magnitude of the required electric power. Conventional photovoltaic arrays are composed of about 10 stages to about 40 stages, and each photovoltaic array is connected in parallel with a switch element for shunting. In other words, as many switch elements for shunting as the steps of a photovoltaic array are provided. Note that the number of stages of the photovoltaic arrays and switch elements is referred to as a shunt stage count.

Such a power controller of shunt system drives switch elements formed of field-effect transistors connected in parallel with the respective photovoltaic arrays to turn on or off, thereby switching between shunting and opening. An operation of switching between turning on and off of the switch element (hereinbelow, referred to as switching) involves heat generation due to a switching loss. In design of a power controller, thermal design is made such that the power controller can withstand a condition of maximum heat generation by switch elements. Accordingly, the power controller has a larger size as a maximum amount of heat generation assumed in individual switch elements is higher.

Thus, a system is devised that can make heat generation of switch elements uniform to reduce a maximum amount of heat generation of individual switch elements for a smaller size and a lighter weight of a power controller (for example, see PTL 1). In this system, the power controller determines a ratio between supplying and shunting of electric power (shunt rate) for each control cycle and based on an amount of excess or deficiency of electric power supplied, and calculates one-times of the switch elements based on this shunt rate. The switch elements are sequentially driven in response to the respective timing signals equally assigned. This makes switching counts of all switch elements uniform, and the switching count of an individual switch element is reduced down to a fraction of the shunt stage count, compared to the switching performed in the entire power controller. This can make the heat generated in the switch elements uniform to reduce a maximum amount of heat generation. The condition of thermal design can thus be relaxed, leading to a smaller size and a lighter weight of a power controller.

CITATION LIST

Patent Literature

PTL 1: Japanese Patent Laying-Open No. 2014-71554

SUMMARY OF INVENTION

Technical Problem

The power controller disclosed in PTL 1 distributes switching performed in the entire power controller to all the switch elements. The switching count of an individual switch element is reduced to a fraction of the shunt stage count, compared to the number of switching in the power controller. On the other hand, in order to achieve this operation, the power controller determines the on-times of the switch elements sequentially one by one and drives the switch elements, for each of the control cycles determined by the equally assigned timing signals. Consequently, a time equivalent to the shunt stage count for each control cycle is necessary for driving all the switch elements, resulting in poor responsiveness.

As the shunt rate needs to be changed to maintain the bus voltage, for example, as the electric power consumed by a load varies, a time equivalent to the shunt stage count for each control cycle is necessary for changing the shunt rates of all the switch elements. This may cause a control delay dependent on the shunt stage count, and in some cases, fail to maintain the bus voltage, leading to destruction of the apparatus.

In order to keep fluctuations of the bus voltage due to such a control delay within an acceptable range, a measure needs to be taken against, for example, an increased capacity of a capacitor (bus capacitor) connected in parallel with a power bus. This may hinder miniaturization of the power controller.

The control delay can be reduced by a reduced control cycle, thereby improving responsiveness. This, however, increases the switching count and also increases an amount of heat generated by an individual switch element in proportion to the switching count. This counters an effect of reducing a maximum amount of heat generation, obtained by making heat generation uniform, which may hinder miniaturization of the power controller.

The present invention has been made to solve the above problem and has an object to provide a power controller with a smaller size and a lighter weight that is able to reduce a maximum amount of heat generated in an individual switch element and resolve a control delay dependent on the shunt stage count.

Solution to Problem

The present invention relates to a power controller connected to a plurality of power supplies and a load. The power controller includes: a plurality of switch elements provided corresponding one-to-one to the plurality of power supplies, each of the plurality of switch elements switching on or off to switch between supplying electric power from a corresponding one of the plurality of power supplies to the load and stopping the supply; an operation processing unit to compute an amount of operation for adjusting the electric power supplied to the load; and a signal generator to compute, based on the amount of operation, a number of switch elements to be turned on among the plurality of switch elements and a duty ratio set to the number of switch elements to be turned on and generate, based on the determined number of switch elements and the determined duty ratio, a signal for driving at least one of the plurality of switch elements. The signal generator includes a correction value operation unit to obtain a correction value based on a difference of an on-pulse width between a shunt current flowing through a corresponding one of the plurality of switch elements and a shunt drive signal for driving the corresponding one of the plurality of switch elements, and a corrector to correct, based on the correction value, an amount of operation output from the operation processing unit.

Advantageous Effects of Invention

The present invention can reduce a maximum amount of heat generated in an individual switch element and resolve a control delay dependent on a shunt stage count, leading to a smaller size and a lighter weight of a power controller.

DESCRIPTION OF EMBODIMENTS

Embodiments will be described below with reference to the drawings.

Embodiment 1

Figure 1:
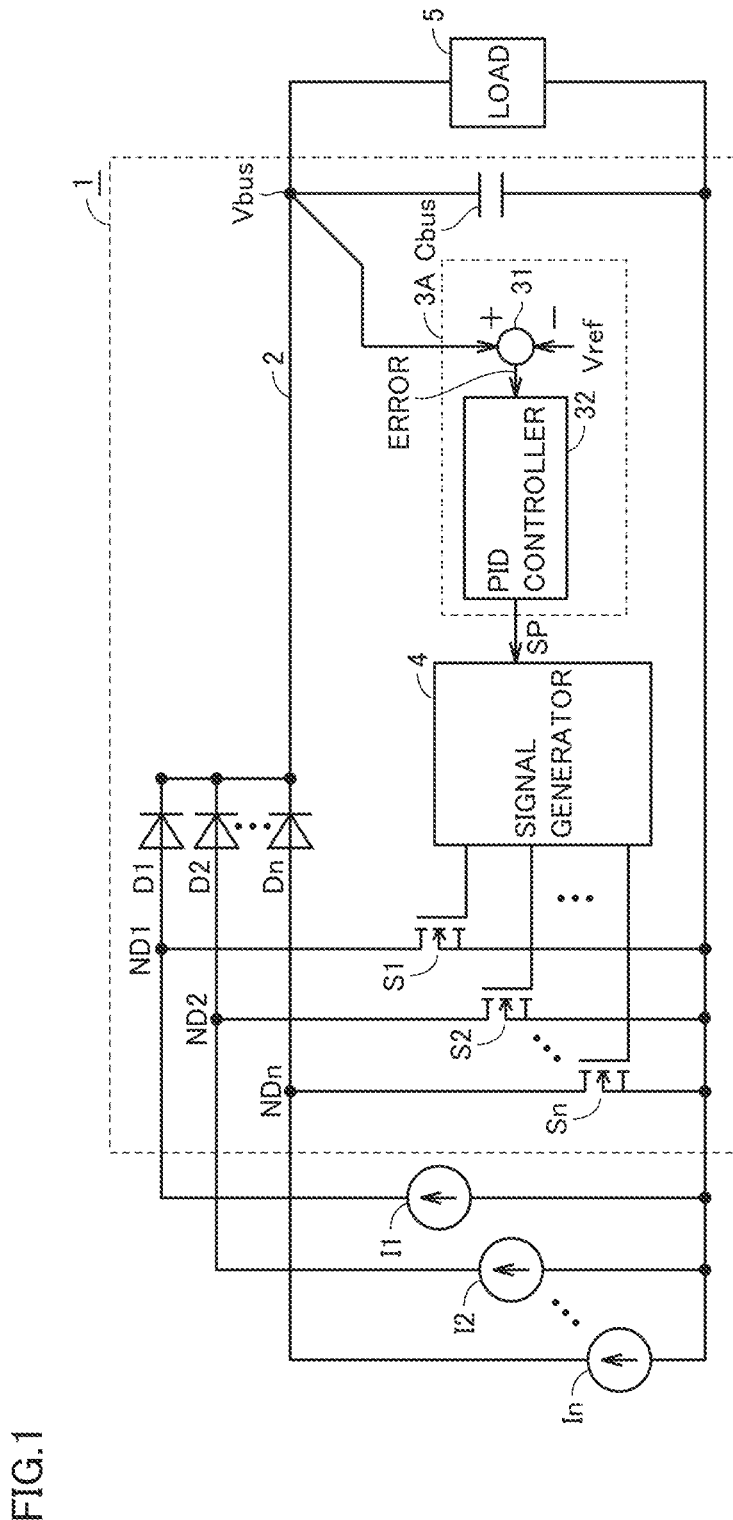
FIG. 1 is a circuit diagram of a power controller according to Embodiment 1.

FIG. 1 is a circuit diagram showing a power controller according to Embodiment 1.

A power controller 1 is connected to a plurality of direct-current (DC) power supplies I1 to In (n is an integer not less than 3), which supply electric power, and a load 5. Power controller 1 controls an amount of electric power supplied from DC power supplies I1 to In to load 5.

DC power supplies I1 to In supply electric power to power controller 1. DC power supplies I1 to In are formed of, for example, photovoltaic arrays, which may be other power supplies that supply electric power. Although it is assumed in the present embodiment that DC power supplies I1 to In are mounted in a satellite, the present invention is not limited thereto. DC power supplies I1 to In may be mounted in other spacecraft such as artificial planets or space stations, as well as apparatuses on the ground, on the sea, or in the air.

Power controller 1 includes a plurality of switch elements S1 to Sn formed of, for example, field-effect transistor (FETs), backflow prevention elements D1 to Dn formed of diodes, a power bus 2, an operation processing unit 3A, a signal generator 4, and a bus capacitor Cbus.

Switch elements S1 to Sn are provided corresponding one-to-one to DC power supplies I1 to In. Switch elements Si (i=1 to n) switch on or off to switch between supplying electric power from their corresponding DC power supplies Ii (i=1 to n) to load 5 and stopping the supply. Switch elements Si to Sn are connected in parallel with DC power supplies I1 to In, respectively. Thus, switch elements Si (i=1 to n) can be turned on to shunt their corresponding DC power supplies Ii (i=1 to n), thus stopping supply of electric power to load 5. Switch elements Si (i=1 to n) can be turned off to stop the supply of electric power from their corresponding DC power supplies Ii (i=1 to n) to load 5.

Although switch elements Si to Sn are each formed of, for example, a switch element including a field-effect transistor (FET), the present invention is not limited thereto. Switch elements S1 to Sn may be formed of other types of switch elements. Although switch elements S1 to Sn are connected in parallel with DC power supplies I1 to In, the present invention is not limited to such a configuration. It suffices that switch elements Si (i=1 to n) can be turned on or off to supply electric power from their corresponding DC power supplies Ii (i=1 to n) to load 5 or stop the supply.

Backflow prevention elements D1 to Dn are provided corresponding one-to-one to DC power supplies I1 to In and are connected in series with DC power supplies I1 to In, respectively. Backflow prevention elements D1 to Dn are each formed of a diode. Backflow prevention elements D1 to Dn prevent a backflow of current into DC power supplies I1 to In. Backflow prevention elements D1 to Dn are examples of elements that prevent a backflow of current into DC power supplies I1 to In and may be replaced by other elements having similar functions.

DC power supplies Ii (i=1 to n) are connected in parallel between drain terminals and source terminals of their corresponding switch elements Si (i=1 to n). DC power supplies Ii (i=1 to n) are connected to power bus 2 via their corresponding backflow prevention elements Di (i=1 to n). Connection nodes NDi (i=1 to n) between positive electrodes of DC power supplies Ii (i=1 to n) and drain terminals of switch elements Si (i=1 to n) are connected to anode terminals of backflow prevention elements Di (i=1 to n). Cathode terminals of backflow prevention elements D1 to Dn are connected to power bus 2. Bus capacitor Cbus and load 5 are connected in parallel to power bus 2.

Operation processing unit 3A generates a shunt command value SP in accordance with a voltage of power bus 2. Shunt command value SP is a command value of an amount of operation of shunting performed by the entire power controller 1, that is, a command value of an amount of operation for adjusting electric power supplied to load 5.

Operation processing unit 3A generates shunt command value SP based on a difference value between bus voltage Vbus of power bus 2 and a predetermined target control value Vref. The generated shunt command value SP is sent to signal generator 4.

Signal generator 4 is connected to switch elements S1 to Sn and operation processing unit 3A. Signal generator 4 determines the number of switch elements to be turned on among switch elements Si to Sn and a duty ratio to be set for the number of switch elements to be turned on, for each control cycle and based on shunt command value SP input from operation processing unit 3A. The duty ratio is a ratio of an on-time to a control cycle of a switch element to be turned on.

Signal generator 4 has output terminals connected to gate terminals of switch elements Si to Sn. Switch elements Si to Sn are driven to turn on or off in response to a drive signal output from signal generator 4.

Load 5 is, for example, a device mounted in a satellite and is connected to power controller 1. Load 5 may be, for example, an electrical storage device, such as a battery, and may be connected via a charge-discharge controller.

Power controller 1 described in Embodiment 1 supplies electric power from DC power supplies I1 to In via power bus 2 to load 5. A voltage supplied to load 5 is maintained by bus capacitor Cbus. Power controller 1 supplies electric power generated from DC power supplies I1 to In to load 5 during daylight hours, while short-circuiting (shunting) a surplus of the generated electric power at appropriate time intervals and at any appropriate ratio, thereby controlling bus voltage Vbus to suppress an increase in bus voltage Vbus.

An operation of power controller 1 in the present embodiment will now be described. In Embodiment 1, operation processing unit 3A outputs shunt command value SP in order to decrease a difference between bus voltage Vbus and the predetermined target control value Vref, thereby controlling bus voltage Vbus to attain to a certain voltage. Shunt command value SP is also an amount of operation for adjusting an amount of electric power supplied to load 5.

Although an operation of operation processing unit 3A will be described below by taking, as an example, a system in which a difference between bus voltage Vbus and target control value Vref is a deviation Error and PID (proportional-integral-derivative) control is performed, the present invention is not limited to such a system. Although target control value Vref is a rated value of bus voltage Vbus, which is generally 50 V to 100 V, the present invention is not limited to this value.

Operation processing unit 3A includes a subtractor 31 and a PID controller 32.

Subtractor 31 calculates deviation Error indicating a difference between bus voltage Vbus of power bus 2, detected by a voltage detector (not shown), and the predetermined target control value Vref. Deviation Error is expressed by Equation (1).

$$\text{Error} = V\text{bus} - V\text{ref} \tag{1}$$

PID controller 32 performs proportional, integral, and derivative operations on deviation Error, and outputs a signal obtained by adding the results thereof as shunt command value SP. Specifically, shunt command value SP is expressed by Equation (2) using constants KP, KI, and KD.

[Math 1]

$$SP = KP \times \text{Error} + KI \int (\text{Error}) dt + KD \frac{d}{dt} \text{Error} \tag{2}$$

Appropriate numeric values not less than 0 are selected for constants KP, KI, and KD in Equation (2) so as to allow for target control with a constant bus voltage in accordance with a circuit constant. Shunt command value SP is a numeric value indicating, in each control cycle, an average number of switch elements to be shunted. Shunt command value SP is any appropriate value of 0 to n in the power controller described in Embodiment 1. It means that the entire generated power is supplied to load 5 when shunt command value SP is 0, and the entire generated power is shunted when shunt command value SP is n to stop supply of electric power to load 5.

Shunt command value SP computed by operation processing unit 3A is transmitted to signal generator 4. Signal generator 4 determines the number of switch elements to be turned on (hereinbelow, referred to as a switch-on count) and a ratio of an on-time to a control cycle of switch elements to be turned on (hereinbelow, referred to as a duty ratio) in order to achieve shunting specified by the input shunt command value SP.

Signal generator 4 drives at least one of switch elements S1 to Sn based on the switch-on count. Signal generator 4 exchanges a switch element to be driven as the switch-on count decreases. In other words, a switch element different from a switch element which has been driven last time is driven.

Figure 2:
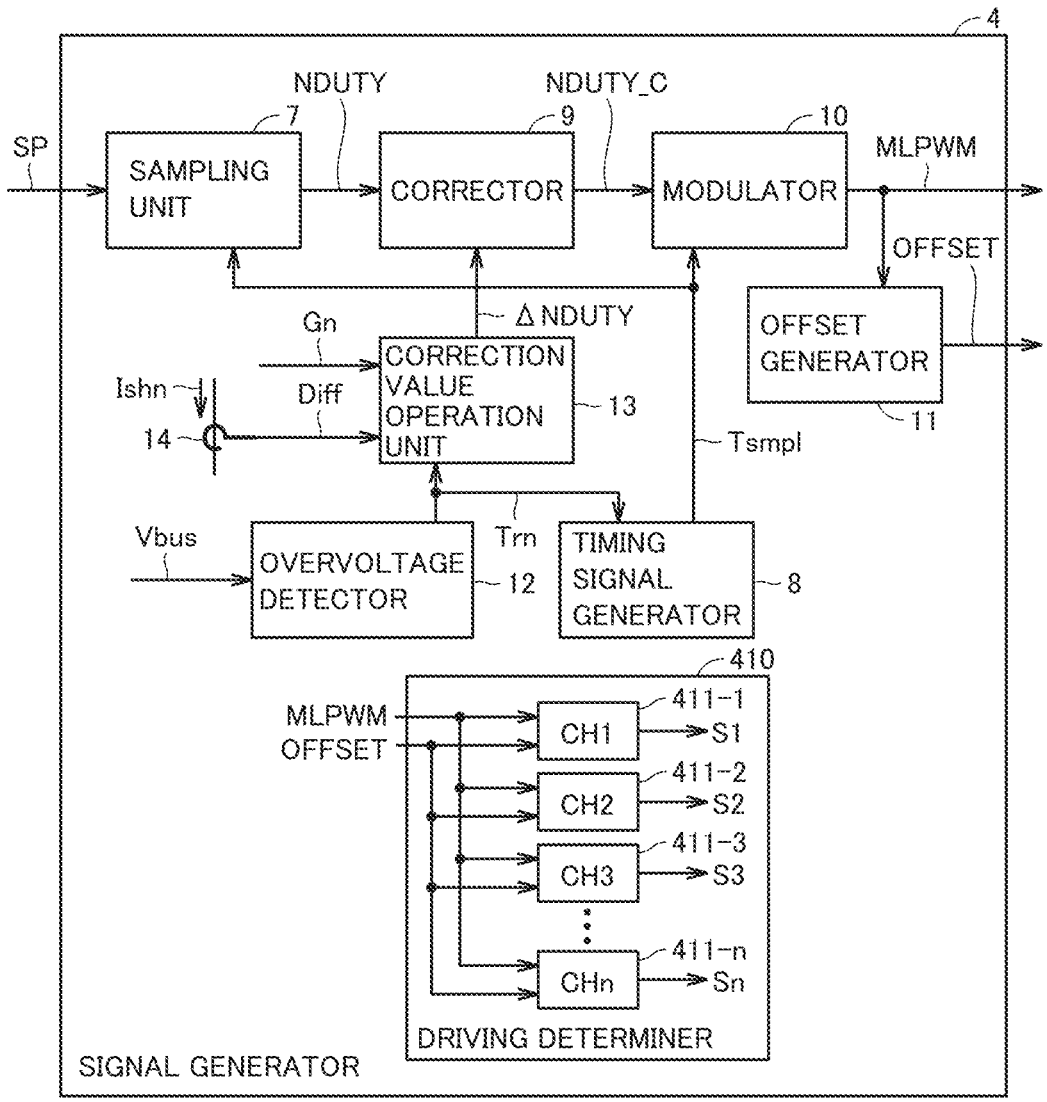
FIG. 2 is a block diagram showing an internal configuration of a signal generator 4 of the power controller according to Embodiment 1.

FIG. 2 is a block diagram showing an internal configuration of signal generator 4 of the power controller according to Embodiment 1.

Signal generator 4 includes a timing signal generator 8, a sampling unit 7, a corrector 9, a modulator 10, an offset generator 11, an overvoltage detector 12, a correction value operation unit 13, and a driving determiner 410.

Timing signal generator 8 outputs a timing signal Tsmpl.

Sampling unit 7 samples shunt command value SP of FIG. 1 in cycles of timing signal Tsmpl, thereby generating a shunt amount NDUTY, which is an amount of operation for adjusting electric power supplied to load 5.

Corrector 9 corrects shunt amount NDUTY and outputs a corrected shunt amount NDUTY_C.

Modulator 10 outputs a switch-on count MLPWM based on the corrected shunt amount NDUTY_C. When the corrected shunt amount NDUTY_C is an integral value, modulator 10 outputs the integral value as switch-on count MLPWM. When the corrected shunt amount NDUTY_C is not an integral value, modulator 10 outputs the sum of an integral part Int and FPWM, which will be described below, as switch-on count MLPWM.

Figure 3:
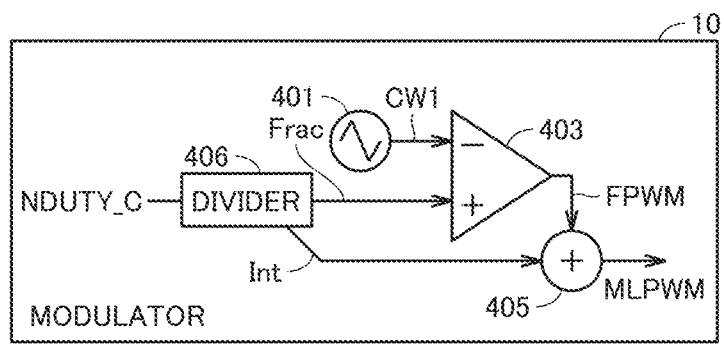
FIG. 3 shows an example internal configuration of a modulator 10 of Embodiment 1.

FIG. 3 shows an example internal configuration of modulator 10 of Embodiment 1.

Modulator 10 includes a carrier wave generator 401, a divider 406, a comparator 403, and an adder 405.

Carrier wave generator 401 outputs a carrier wave cw1.

Divider 406 divides the corrected shunt amount NDUTY_C output from corrector 9 into integral part Int and a fractional part Frac. Since the effective range of shunt amount NDUTY_C is 0 to n, integral part Int is an integral value of 0 to n, and fractional part Frac is a fractional value not less than 0 and less than 1.

Comparator 403 compares fractional part Frac with carrier wave cw1, thereby generating a fractional part PWM (Pulse Width Modulation) signal FPWM. Fractional part PWM signal FPWM assumes a value of 0 or 1 at any appropriate duty ratio. An average of fractional part PWM signal FPWM is fractional part Frac.

Adder 405 adds integral part Int and fractional part PWM signal FPWM (0 or 1) together, thereby calculating switch-on count MLPWM. The calculated switch-on count MLPWM is sent to driving determiner 410 of FIG. 2 and is also sent to offset generator 11.

Referring again to FIG. 2, offset generator 11 converts switch-on count MLPWM into an offset value OFFSET. Offset value OFFSET is sent to driving determiner 410.

Upon detection of a decrease in switch-on count MLPWM, offset generator 11 performs modulo addition of an amount of the decrease and offset value OFFSET modulo n, thereby updating offset value OFFSET. Offset value OFFSET is a value indicating a starting point of switch elements to be driven and assumes an integral value of 0 to (n−1). Switch element Si is a starting point when offset value OFFSET is 0, and switch element S2 is a starting point when offset value OFFSET is 1.

Since the determined switch-on count MLPWM and offset value OFFSET fix the number of switch elements to be turned on among switch elements Si to Sn and a starting point of the switch elements to be turned, the driving state (on/off) of switch elements Si to Sn can be determined uniquely.

Driving determiner 410 includes determiners 411-1 to 411-n.

Determiner 411-$i$ ($i$=1 to n) determines whether switch element Si ($i$=1 to n) belongs to the range where the switch element Si is to be turned on, and determines whether to drive switch element Si. In an example determination method, switch element Si with a shunt number i can be driven when any of Inequalities (3) and (4) composed of shun number i, shunt stage count n, switch-on count MLPWM, and offset value OFFSET is satisfied.

$$\text{OFFSET} \leq i < (\text{OFFSET} + \text{MLPWM}) \tag{3}$$

$$\text{OFFSET} \leq (n+i) < (\text{OFFSET} + \text{MLPWM}) \tag{4}$$

Figure 4:
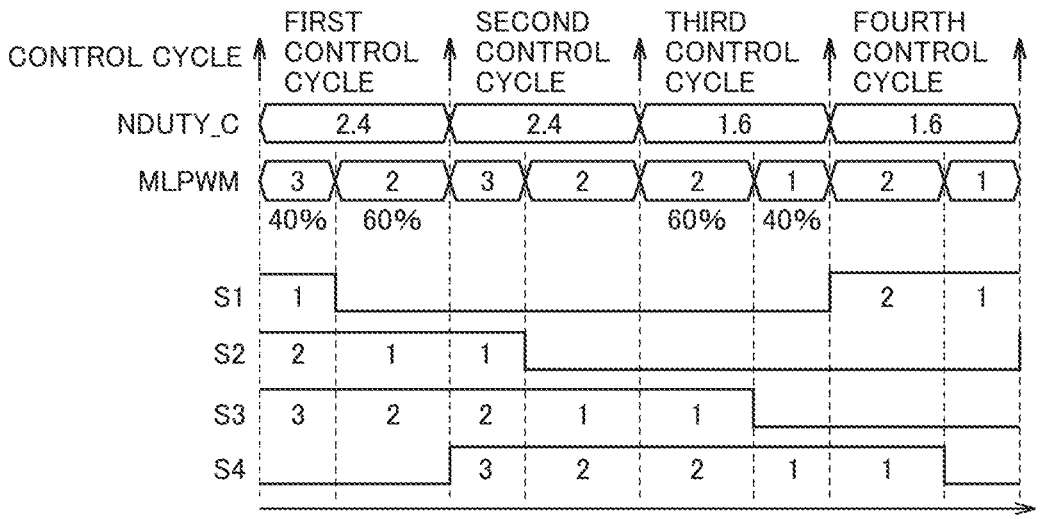
FIG. 4 is a timing chart showing time changes of a shunt amount NDUTY_C, a switch-on count MLPWM, and states of switch elements S1 to S4.
Figure 5:
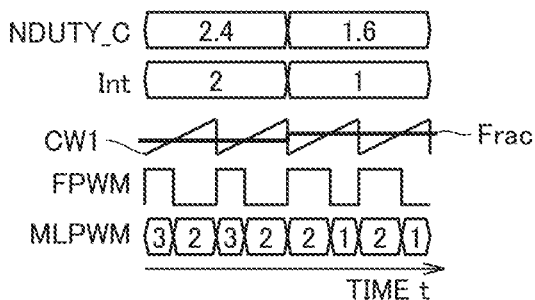
FIG. 5 is a timing chart showing time changes of shunt amount NDUTY_C, an integral part Int, a carrier wave cw1, a fractional part PWM signal FPWM, and switch-on count MLPWM.
Figure 6:
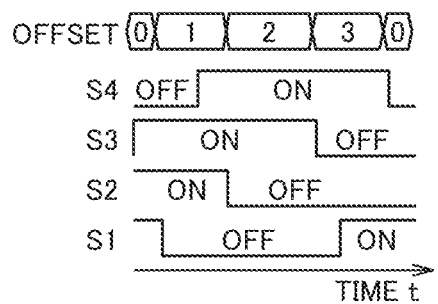
FIG. 6 is a timing chart showing time changes of an offset value OFFSET and the states of switch elements S1 to S4.

FIG. 4 is a timing chart showing time changes of shunt amount NDUTY_C, switch-on count MLPWM, and the states of switch elements Si to S4. FIG. 5 is a timing chart showing time changes of shunt amount NDUTY_C, integral part Int, carrier wave cw1, fractional part PWM signal FPWM, and switch-on count MLPWM. FIG. 6 is a timing chart showing time changes of offset value OFFSET and the states of switch elements S1 to S4.

In FIGS. 4 to 6, the horizontal axis represents a lapse of time, and the vertical line represents the state of each signal. Although the case where shunt stage count n is 4 is illustrated here by way of example for ease of explanation, the present invention is not limited to this value.

Illustrated here is an example operation when 2.4 and 1.6 are provided as the corrected shunt amount NDUTY_C.

In the first and second control cycles, 2.4 is input as the corrected shunt amount NDUTY_C.

Divider 406 divides the corrected shunt amount NDUTY_C(=2.4) output from corrector 9 into integral part Int (=2) and fractional part Frac (=0.4). Comparator 403 compares fractional part Frac (=0.4) with carrier wave cw1 generated in carrier wave generator 401, thereby generating fractional part PWM signal FPWM. Adder 405 adds integral part Int (=2) and fractional part PWM signal FPWM (0 or 1, average=0.4) together, thereby calculating switch-on count MLPWM (2 or 3).

Thus, switch-on count MLPWM=3 in 40% of control cycle T, and switch-on count MLPWM=2 in 60% of control cycle T. An average of switch-on counts MLPWM in the first and second control cycles is 2.4.

Switch-on count MLPWM is 3 at an initial timing of the first control cycle. As a result, three switch elements S1, S2, and S3 are turned on starting from switch element S1.

Switch-on count MLPWM decreases to 2 at a subsequent timing of the first control cycle. Offset generator 11 performs modulo addition of an amount of the decrease (=1) of switch-on count MLPWM and offset value OFFSET (0) modulo 4, thereby updating offset value OFFSET to "1". Thus, two switch elements are turned on starting from switch element S2 while rotating switch elements to be driven. Specifically, switch elements S2 and S3 are turned on.

At an initial timing of the second control cycle, switch-on count MLPWM increases to 3, and accordingly, three switch elements are turned on while keeping switch element S2 as the starting point, without rotation. Specifically, switch elements S2, S3, and S4 are turned on.

Subsequently, switch-on count MLPWM decreases to 2 at a subsequent timing of the second control cycle. Offset generator 11 performs modulo addition of an amount of the decrease (=1) of switch-on count MLPWM and offset value OFFSET (1) modulo 4, thereby updating offset value OFFSET to "2". Thus, two switch elements are turned on starting from switch element S3. Specifically, switch elements S3 and S4 are turned on.

In the third and fourth control cycles, 1.6 is input as a shunt command value. Divider 406 divides the corrected shunt amount NDUTY_C(=1.6) output from corrector 9 into integral part Int (=1) and fractional part Frac (=0.6). Comparator 403 compares fractional part Frac (=0.6) with carrier wave cw1 generated in carrier wave generator 401, thereby generating fractional part PWM signal FPWM. Adder 405 adds integral part Int (=1) and fractional part PWM signal FPWM (0 or 1, average=0.6) together, thereby calculating switch-on count MLPWM (1 or 2).

Thus, switch-on count MLPWM=2 in 60% of control cycle T, and switch-on count MLPWM=1 in 40% of control cycle T. An average of switch-on counts MLPWM in the third and fourth control cycles is 1.4.

The state where switch-on count MLPWM is 2 continues at an initial timing of the third control cycle. Thus, a state in which switch elements S3 and S4 are turned on and switch elements S1 and S2 are turned off continues.

Switch-on count MLPWM decreases to 1 at a subsequent timing of the third control cycle. Offset generator 11 performs modulo addition of an amount of the decrease (=1) of switch-on count MLPWM and offset value OFFSET (2) modulo 4, thereby updating offset value OFFSET to "3". Thus, one switch element is turned on starting from switch element S while rotating switch elements to be driven. Specifically, switch element S4 is turned on.

At an initial timing of the fourth control cycle, switch-on count MLPWM increases to 2, and accordingly, two switch elements are turned on while keeping switch element S4 as the starting point, without rotation. Specifically, switch elements S4 and S1 are turned on.

Switch-on count MLPWM decreases to 1 at a subsequent timing of the fourth control cycle. Offset generator 11 performs modulo addition of an amount of the decrease (=1) of switch-on count MLPWM and offset value OFFSET (3) modulo 4, thereby updating offset value OFFSET to "0". Thus, one switch element is turned on starting from switch element S0 while rotating a switch element to be driven. Specifically, switch element S1 is turned on.

As a switch element which is a starting point to be turned on for each control cycle changes, the switching operation can be distributed to all of switch elements S1 to S4, as described above. Accordingly, a timing of switching one switch element can be reduced to one time in four control cycles 4T.

As a result, when considering power controller 1 in which the shunt stage count is n as a whole, the switching operation of each of switch elements S1 to Sn is performed for every n control cycles while performing switching in the same cycle as the control cycle. Since a switching count of each of switch elements S1 to Sn is reduced to 1/n of the switching count of the entire power controller 1, a heat generation condition required for switch elements S1 to Sn is relaxed. The switch element is driven by determining the states of all the switch elements for each control cycle, which causes no control delay dependent on shunt stage count n.

In the power controller described in Embodiment 1, a switch element which is a starting point is rotated as the switch-on count decreases as described above, and thus, a switch element with the longest on-time among a plurality of turned-on switch elements is turned off. Similarly, switch elements for an amount of switch-on count are turned on from a switch element which is a starting point as the switch-on count increases, and thus, a switch element with the longest off-time among a plurality of turned-off switch elements is turned on. The case where the switch-on count decreases by one is described here, which shows a configuration in which a switch element serving as a starting point is rotated by one. Alternatively, when the switch-on count decreases by two or more, a rotation may be performed correspondingly.

In FIG. 2, the cycle of timing signal Tsmpl is set to reduce heat generation through switching of switch elements Si to Sn in a stationary operation.

A bus voltage control operation is performed accompanied by PID control in cycles of timing signal Tsmpl, and accordingly, a negative feedback voltage control operation is updated for each certain switching cycle. As a result, bus voltage Vbus cannot be controlled for more rapid load fluctuations than the switching cycle, and accordingly, the bus voltage may transiently fluctuate. Overvoltage detector 12 is provided as a measure taken when bus voltage Vbus fluctuates greatly due to sudden fluctuations of load 5.

When a fluctuation range of bus voltage Vbus, which is a voltage supplied to load 5, exceeds a preset fluctuation range due to fluctuations of load 5, overvoltage detector 12 outputs overvoltage detection signal Trn to timing signal generator 8. Upon receipt of overvoltage detection signal Trn, timing signal generator 8 enters a transient response state, thus reducing the cycle of timing signal Tsmpl. This leads to a more rapid bus voltage control response, thus preventing transient occurrence of large fluctuations of bus voltage.

After fluctuations of bus voltage Vbus converge, timing signal generator 8 waits for a time that elapses before heat generation of switch elements Si to Sn is less affected. Timing signal generator 8 then returns the cycle of timing signal Tsmpl to the cycle in the original stationary operation. This reduces the cycle of timing signal Tsmpl by a period of the transient response state, thus preventing heat generation of switch elements Si to Sn from being affected.

In the above operation, however, at a timing at which timing signal Tsmpl with a reduced cycle returns to an original cycle after fluctuations of bus voltage Vbus converge, bus voltage Vbus may fluctuate again.

Figure 7:
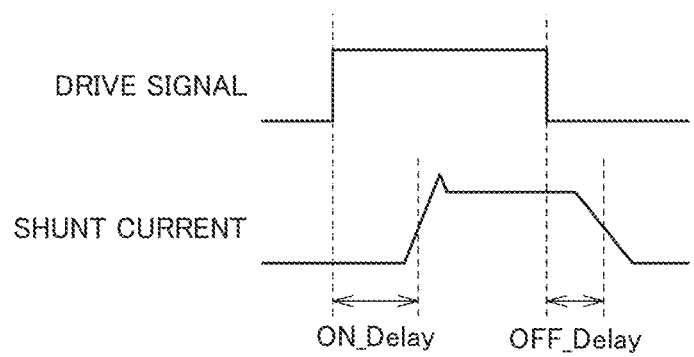
FIG. 7 shows waveforms of a shunt drive signal and a shunt current.

FIG. 7 shows waveforms of a shunt drive signal and a shunt current.

As shown in FIG. 7, a shunt current actually flowing through switch elements Si to Sn may delay with respect to rising and falling of shunt drive signals of switch elements Si to Sn. Specifically, a delay time ON_Delay in turn-on may be different from a delay time OFF_Delay in turn-off. In such a case, ON_Duty, which is a ratio of an on-time to a switching cycle, and effective ON_Duty, which is a ratio of an on-time to a switching cycle of an effective shunt current, differ dependent on the cycle of timing signal Tsmpl. Since effective ON_Duty changes at a timing of switching of the cycle of timing signal Tsmpl, bus voltage Vbus fluctuates. Such fluctuations return through a feedback control operation of bus voltage Vbus after a lapse of a response time of a control system. Correction value operation unit 13 is provided as a measure taken against this phenomenon.

Correction value operation unit 13 performs a correction operation on a difference between effective ON_Duty, which changes dependent on the cycle of timing signal Tsmpl, and ON_Duty of a shunt drive signal, using a value regarded as correction value $\Delta$NDUTY in advance regardless of a bus voltage control response operation. This can prevent a phenomenon in which bus voltage Vbus fluctuates again at a timing at which timing signal Tsmpl returns to an original cycle after fluctuations of bus voltage Vbus converge.

When a delay time during ON of a shunt current is ON_Delay and a delay time during OFF is OFF_Delay with respect to a shunt drive signal, a difference $\Delta P_W$ of an on-pulse width between a shunt current and a shunt drive signal is expressed by Equation (5). The difference $\Delta P_W$ is a difference between an on-pulse width of a shunt current and an on-pulse width of a shunt drive signal.

$$\Delta P_W = \text{ON\_Delay} - \text{OFF\_Delay} \quad (5)$$

Correction value $\Delta$NDUTY, which is an amount of change of shunt amount NDUTY caused by a difference $\Delta P_W$ of the on-pulse width, is expressed by Equation (6) where the cycle of timing signal Tsmpl is T.

$$\Delta \text{NDUTY} = n \times \Delta P_W / T \quad (6)$$

Correction value operation unit 13 calculates correction value $\Delta$NDUTY in accordance with Equations (5) and (6).

A difference $\Delta P_W$ of on-pulse width expressed by Equation (5) is a value dependent on the characteristics of switch elements Si to Sn and a design condition of a shunt driving unit. A value of difference $\Delta P_W$ of on-pulse width thus may be a numeric value determined in design of an apparatus or a numeric value measured in release testing. It is conceivable that difference $\Delta P_W$ of on-pulse width may fluctuate though it fluctuates by a small amount. Such fluctuations result from temperature fluctuations, a change over the years, or the like, resulting in gradual fluctuations. In the case of gradual fluctuations, correction value operation unit 13 periodically measures difference $\Delta P_W$ of on-pulse width, and calculates correction value $\Delta$NDUTY for each cycle T of timing signal Tsmpl in accordance with Equation (6).

Corrector 9 corrects shunt amount NDUTY to NDUTY_C in accordance with Equation (7).

$$NDUTY\_C=NDUTY-\Delta NDUTY \tag{7}$$

This also enables a correction operation on shunt amount NDUTY in synchronization with a switch of cycle T regardless of the bus voltage control response operation.

When large fluctuations of difference $\Delta P_W$ of on-pulse width are accommodated, for example, operations of Equations (5) and (6) may be performed based on a representative shunt drive signal Gn and a differential detection signal Diff of shunt current Ishn to calculate correction value $\Delta$NDUTY. Shunt drive signal Gn is a signal for driving switch element Sn. Shunt current Ishn is a current flowing through switch element Sn. Differential detection signal Diff is obtained from, for example, simple current detector 14 including a current transformer or the like.

Next, specific configurations of corrector 9 and correction value operation unit 13 in FIG. 2 will be described.

Figure 8:
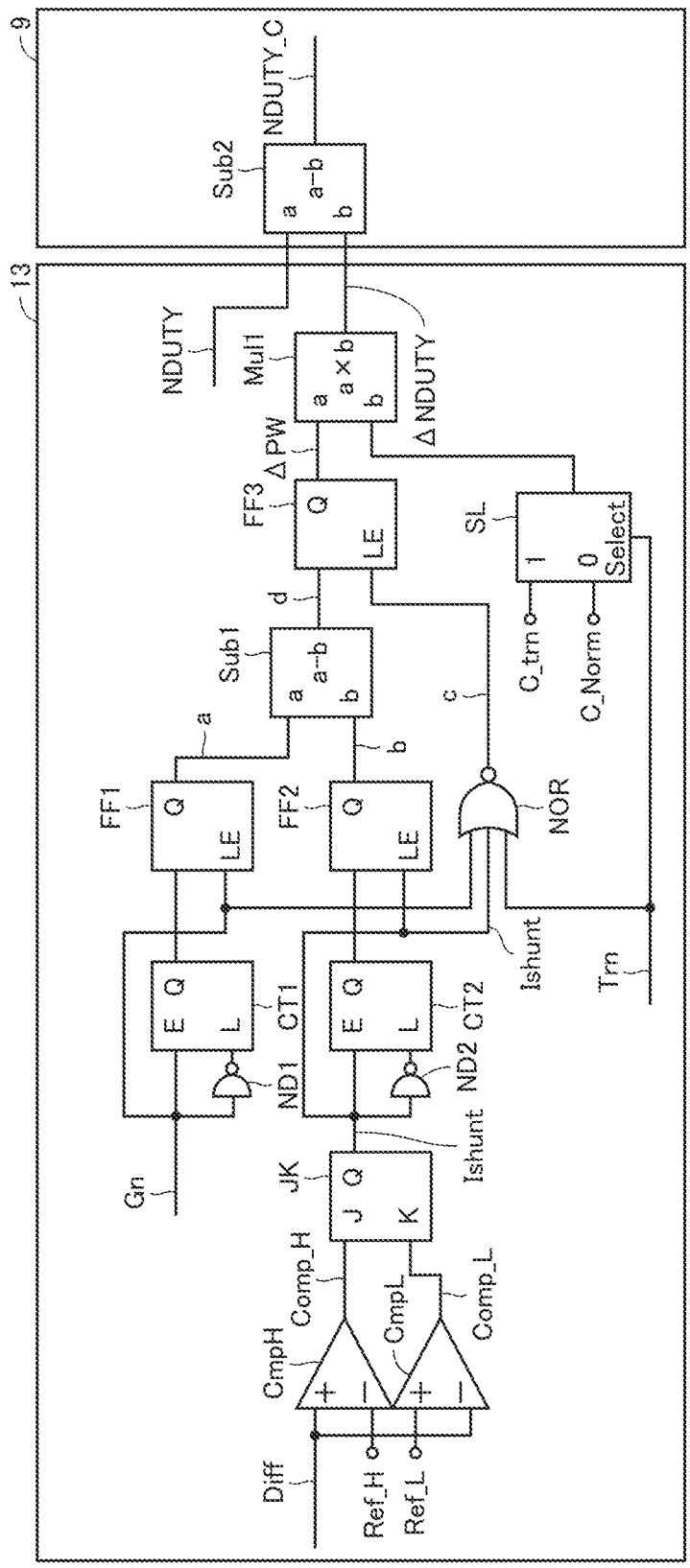
FIG. 8 is a block diagram showing example configurations of a correction value operation unit 13 and a corrector 9.

FIG. 8 is a block diagram showing example configurations of correction value operation unit 13 and corrector 9.

Figure 9:
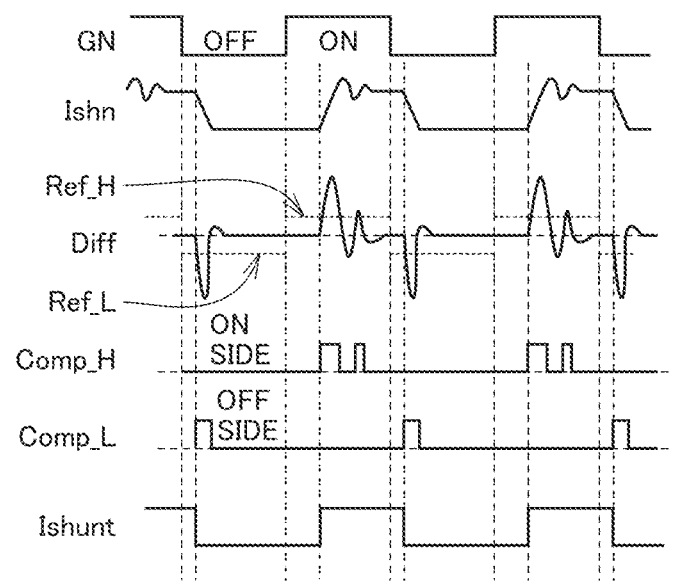
FIG. 9 is a timing chart showing signals transmitted in correction value operation unit 13 and corrector 9.
Figure 10:
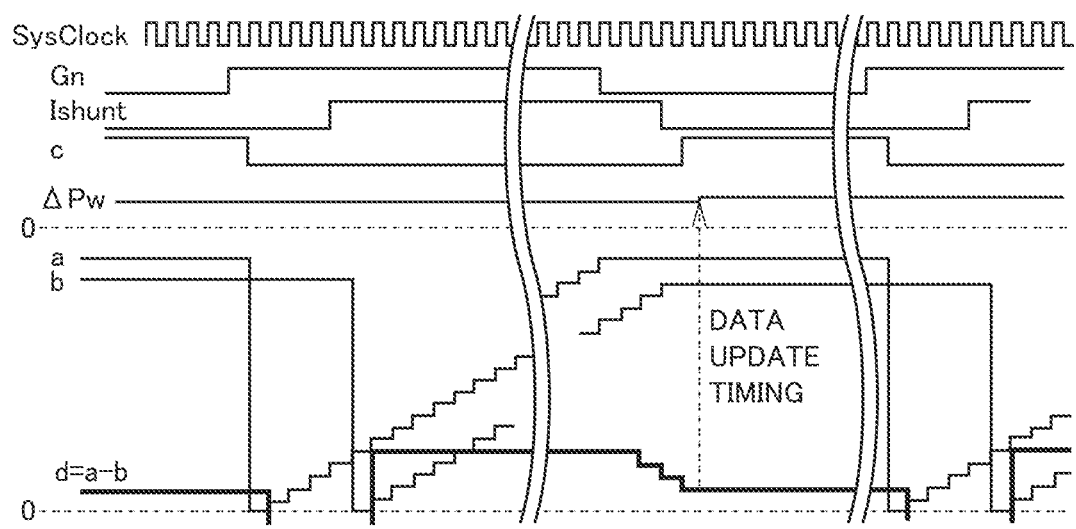
FIG. 10 is a timing chart showing signals transmitted in correction value operation unit 13 and corrector 9.

FIGS. 9 and 10 are timing charts showing signals transmitted in correction value operation unit 13 and corrector 9.

A main part of the operation of obtaining difference $\Delta P_W$ of on-pulse width and a corrected shunt amount NDUTY_C will be described with reference to FIGS. 8 to 10.

A comparator CmpH compares differential detection signal Diff that has a differentiated waveform, detected from shunt current Ishn, with a reference value Ref_H, and outputs a result of the comparison as an on-timing signal Comp_H of shunt current Ishn.

Comparator CmpL compares differential detection signal Diff that has a differentiated waveform, detected from shunt current Ishn, with a reference value Ref_L and outputs a result of the comparison as an off-timing signal Comp_L of shunt current Ishn.

A JK flip-flop JK includes a J input terminal that receives on-timing signal Comp_H of shunt current Ishn and a K input terminal that receives off-timing signal Comp_L of shunt current Ishn and generates a shunt current synchronization signal Ishunt.

Operations described hereinbelow are performed in synchronization with a clock signal Sysclock.

A counter CT1 receives shunt drive signal Gn corresponding to shunt current Ishn and counts a pulse number of clock signal Sysclock during an ON period of shunt drive signal Gn.

A flip-flop FF1 holds an output from counter CT1 in response to shunt drive signal Gn to output a count value a during the ON period of shunt drive signal Gn.

A counter CT2 receives shunt current synchronization signal Ishunt corresponding to shunt current Ishn and counts a pulse number of clock signal Sysclock during the ON period of shunt current synchronization signal Ishunt.

A flip-flop FF2 holds an output from counter CT2 in response to shunt current synchronization signal Ishunt to output a count value b during an ON period of shunt current synchronization signal Ishunt.

A subtractor Sub1 subtracts count value b during the ON period of shunt current synchronization signal Ishunt from count value a during the ON period of shunt drive signal Gn and outputs a difference d.

Counter CT1 and counter CT2 each include a zero-load input L and perform a count operation during the ON periods of shunt drive signal Gn and shunt current synchronization signal Ishunt, accompanied by NAND circuits ND1 and ND2.

A NOR circuit NOR outputs a timing signal c indicating a period in which both of shunt drive signal Gn and shunt current synchronization signal Ishunt are OFF when overvoltage detection signal Trn is not output, that is, during the stationary operation.

A flip-flop FF3 holds a difference d between the count values in accordance with timing signal c to generate a difference $\Delta P_W$ of the on-pulse width. Specifically, difference $\Delta P_W$ of the on-pulse width due to difference d of the count value is generated during a period in which both of shunt drive signal Gn and shunt current synchronization signal Ishunt are OFF in the state where overvoltage detection signal Trn is not output, that is, during the stationary operation.

A selector SL selects a coefficient C_trn or C_Norm in accordance with whether it is a time at which overvoltage detection signal Trn is output. Coefficient C_trn is a coefficient corresponding to the time at which overvoltage detection signal Trn is output. Coefficient C_Norm is a coefficient corresponding to a time at which overvoltage detection signal Trn is not output. Coefficient C_trn and coefficient C_Norm are expressed by Equations (8) and (9), respectively, from Equations (6) using a total number n of switch elements Si to Sn.

$$C\_trn=n/Ttrn \tag{8}$$

$$C\_Norm=n/Tnrm \tag{9}$$

Ttrn in Equation (8) represents a cycle of timing signal Tsmpl when overvoltage detection signal Trn is output, that is, in the transient response state. Tnrm in Equation (9) represents a cycle of timing signal Tsmpl when overvoltage detection signal Trn is not output, that is, in the stationary operation. The following is satisfied. Specifically, the length of the control cycle in the transient response state is shorter than the length of the control cycle in the stationary operation.

$$Ttrn<Tnrm \tag{10}$$

A multiplier Mull multiplies difference $\Delta P_W$ of the on-pulse width by an output from selector SL, thereby generating a correction value $\Delta$NDUTY.

A subtractor Sub2 generates a shunt amount NDUTY_C obtained by correction through subtraction of correction value $\Delta$NDUTY from shunt amount NDUTY.

Since fluctuations of difference $\Delta P_W$ of the on-pulse width are small as described above, a fixed value can be used when such fluctuations can be ignored. In such a case, the product of C_trn and $\Delta P_W$ and the product of C_Norm and $\Delta P_W$ are calculated in advance and provided, leading to a reduced size of the circuit.

Since a coefficient to be maintained can be reduced to one by using the numerical values expressed by Equations (11) and (12) as coefficients C_trn and C_Norm, similar effects can be obtained while reducing the size of the circuit.

$$C\_trn=(n/Ttrn)-(n/Tnrm) \tag{11}$$

$$C\_Norm=0 \tag{12}$$

Figure 11:
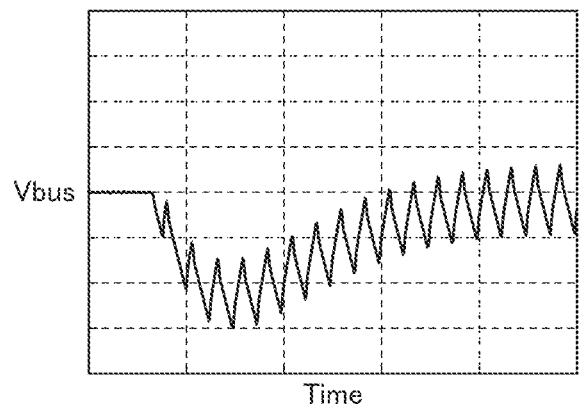
FIG. 11 shows a simulation result of a waveform of a bus voltage Vbus when pulse width correction control is not performed.
Figure 12:
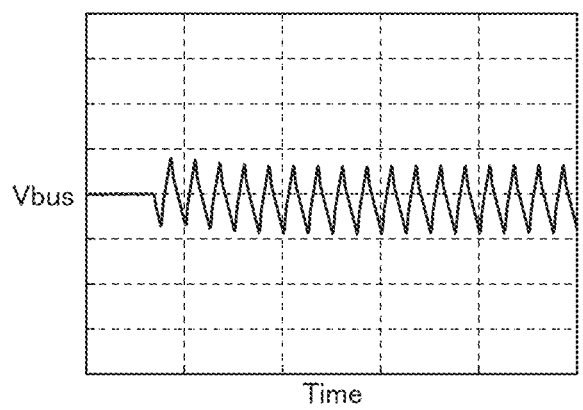
FIG. 12 shows a simulation result of a waveform of bus voltage Vbus when pulse width correction control is performed.

FIG. 11 shows a simulation result of a waveform of bus voltage Vbus when pulse width correction control is not performed. FIG. 12 shows a simulation result of the waveform of bus voltage Vbus when pulse width correction control is performed.

The simulation result is obtained by simulating fluctuations of bus voltage Vbus when the state in which the cycle of timing signal Tsmpl is shorter in the transient response state is returned to the state in which the normal cycle of timing signal Tsmpl. The cycle of timing signal Tsmpl is switched in the vicinity of 15% of the horizontal axis. It is found that when pulse width correction control is not performed, bus voltage Vbus decreases due to fluctuations of effective ON_Duty. When pulse width correction control described in Embodiment 1 is performed, effective ON_Duty can be kept constant, thus reducing fluctuations of bus voltage Vbus.

In the power controller described in the present embodiment, the power controller that performs control with a constant bus voltage obtains a shunt command value, which is an average of the numbers for shunt, from a deviation between a bus voltage and a target value, and rotates a switch element to be driven, at a timing at which the switch-on count increases or decreases while controlling a switch-on count of switch elements and a duty ratio, as described above. This causes no delay dependent on shunt stage count n while reducing the switching frequency of an individual switch element to 1/n, leading to high responsiveness. Further, the switching cycle is made variable in accordance with the magnitude of load fluctuations, thus improving a response during load fluctuations while reducing heat generation in the stationary state. Additionally, fluctuations of a bus voltage can be reduced by correcting effective ON_Duty generated in switch of the switching cycle.

The present embodiment can thus reduce heat generation associated with switching while maintaining the stability of a bus voltage. The present embodiment can thus relax the condition for selecting components and heat dissipation design. Consequently, a power controller can be provided that has a high response, a smaller size, a smaller weight, and an excellent electrical power quality.

Variation of Embodiment 1

Power controller 1 of a variation of Embodiment 1 is obtained by modifying the internal configurations of modulator 10 and driving determiner 410 in power controller 1 of Embodiment 1. The other configuration of the power controller of the variation of Embodiment 1 is similar to that of FIG. 1, which will not be described repeatedly.

Figure 13:
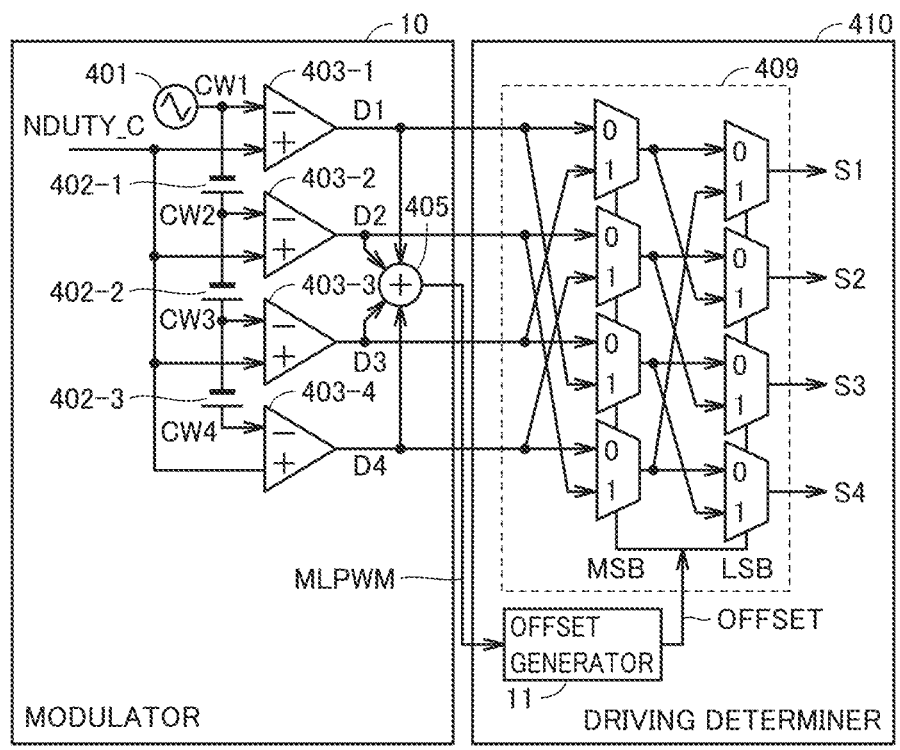
FIG. 13 shows examples of a modulator 10 and a driving determiner 410 according to a variation of Embodiment 1.

FIG. 13 shows examples of modulator 10 and driving determiner 410 of the variation of Embodiment 1. The case where shunt stage count n is 4 will be described here for ease of explanation.

Modulator 10 includes carrier wave generator 401, offset superimposing units 402-1 to 402-3, comparators 403-1 to 403-4, and an adder 405.

Driving determiner 410 includes an offset generator 11 and a drive signal assignment unit 409.

Figure 14:
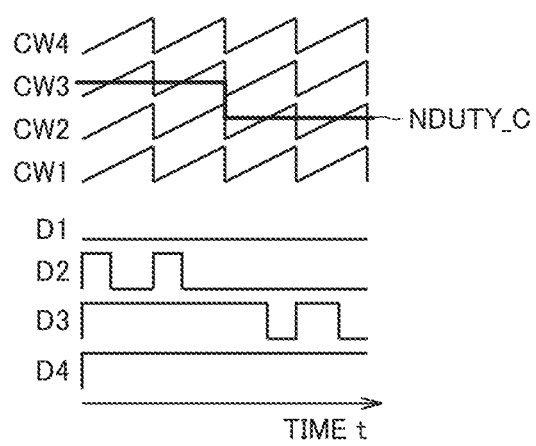
FIG. 14 is a timing chart showing waveforms of signals transmitted in modulator 10 and driving determiner 410 of FIG. 13.
Figure 15:
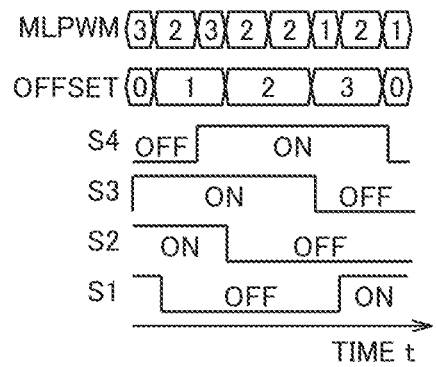
FIG. 15 is a timing chart showing waveforms of signals transmitted in modulator 10 and driving determiner 410 of FIG. 13.

FIGS. 14 and 15 are timing charts showing the waveforms of signals transmitted in modulator 10 and driving determiner 410 of FIG. 13.

Carrier wave generator 401 generates a carrier wave cw1 having an amplitude of 1 and sends carrier wave cw1 to comparator 403-1 and offset superimposing unit 402-1.

Offset superimposing unit 402-1 sends, to offset superimposing unit 402-2 and comparator 403-2, a signal cw2 obtained by adding an offset equal to the amplitude of carrier wave cw1 to carrier wave cw1.

Offset superimposing unit 402-2 sends, to offset superimposing unit 402-3 and comparator 403-3, a signal cw3 obtained by adding an offset equal to the amplitude of carrier wave cw1 to signal cw2.

Offset superimposing unit 402-3 sends, to comparator 403-4, a signal cw4 obtained by adding an offset equal to the amplitude of carrier wave cw1 to signal cw3.

Comparator 403-$i$ ($i=1$ to 4) compares the corrected shunt amount NDUTY_C with carrier wave cw1 and outputs a PWM signal Pi. When shunt amount NDUTY_C is greater than carrier wave cw1, PWM signal Pi is "1". When shunt amount NDUTY_C is not greater than carrier wave cw1, PWM signal Pi is "0". An output from comparator 403 with the number corresponding to the switch-on count MLPWM is "1".

This operation yields a PWM signal obtained by dividing a signal domain by the shunt stage count.

Adder 405 adds PWM signals P1 to P4, which are outputs from comparators 403-1 to 403-4, together and outputs switch-on count MLPWM.

Offset generator 11 assigns offset value OFFSET based on switch-on count MLPWM as in Embodiment 1.

PWM signal determined so far and offset value OFFSET fix a drive pattern of switch elements and a starting point thereof, and accordingly, the drive state (on/off) of each switch element can be determined uniquely.

Drive signal assignment unit 409 performs a cyclic shift operation on PWM signal Pi output from comparator 403-$i$ by offset value OFFSET to drive each switch element to be turned on or off. Although FIG. 13 shows an example in which two-input, one-output multiplexers are combined for cyclic shift, a multi-input multiplexer may be used for cyclic shift.

Embodiment 2

Power controller 1 of Embodiment 2 is obtained by modifying the internal configuration of signal generator 4 in power controller 1 of Embodiment 1. The other configuration of the power controller according to Embodiment 2 is similar to that of FIG. 1, which will not be described repeatedly.

Figure 16:
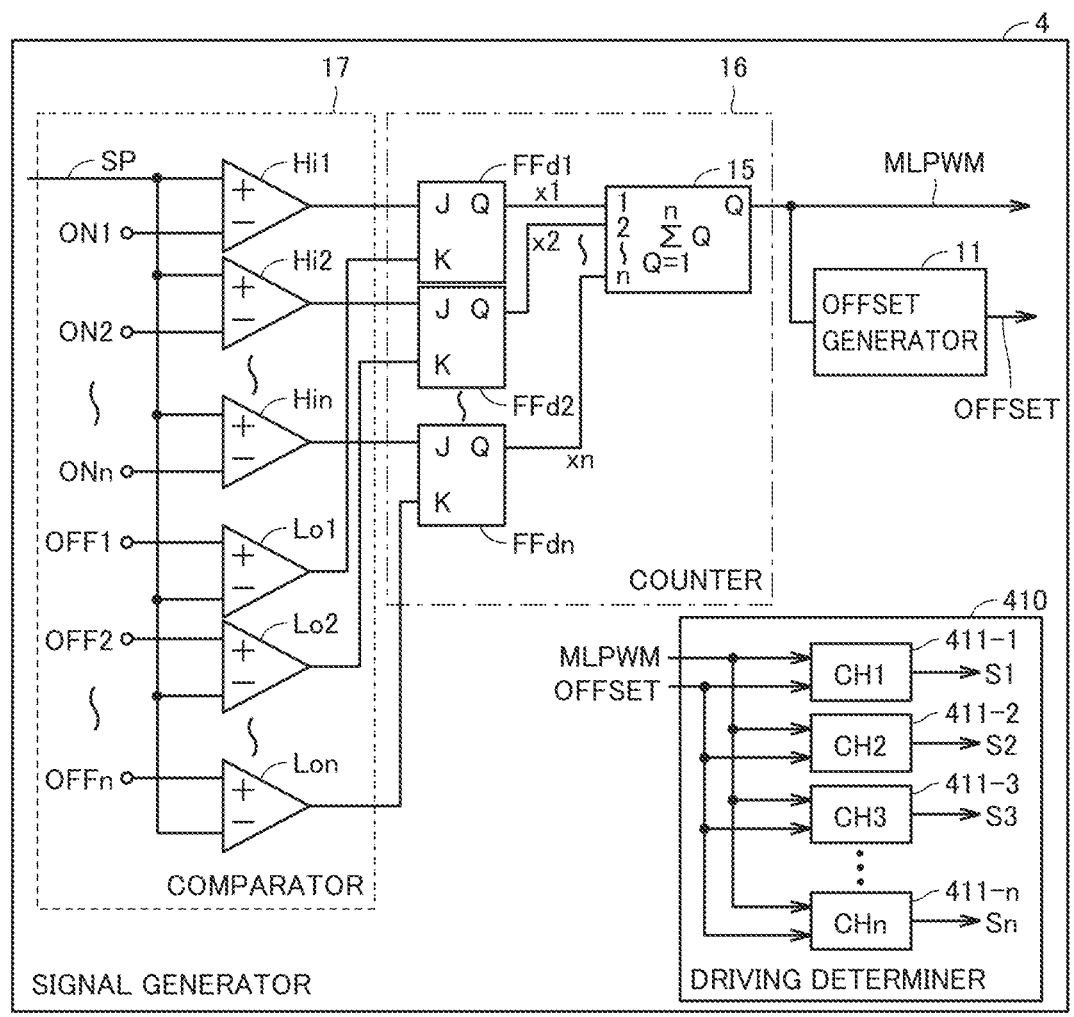
FIG. 16 is a block diagram showing an internal configuration of a signal generator 4 of a power controller 1 according to Embodiment 2.

FIG. 16 is a block diagram showing an internal configuration of signal generator 4 of power controller 1 of Embodiment 2.

Signal generator 4 includes a comparator 17, a counter 16, offset generator 11, and driving determiner 410. Offset generator 11 and driving determiner 410 are similar to those of Embodiment 1, which will not be described repeatedly.

Comparator 17 compares first to n-th on-level thresholds, which are assigned within a variable range of shunt command value SP, and first to n-th off-level thresholds, which are assigned to have a hysteresis corresponding one-to-one to the first to n-th on-level thresholds, with shunt command value SP.

Counter 16 determines switch-on count MLPWM based on a result of the comparison of comparator 17.

Comparator 17 includes n number of on-comparators Hii ($i=1$ to n) and n number of comparators Loi ($i=1$ to n).

Counter 16 includes n number of JK flip-flops FFdi ($i=1$ to n) and an adder 15. The JK flip-flops may be replaced by RS flip-flops.

An i-th on-comparator Hii compares shunt command value SP with an i-th on-level threshold ONi. The i-th on-comparator Hii outputs "1" when shunt command value SP is greater than the i-th on-level threshold ONi and outputs "0" when shunt command value SP is smaller than the i-th on-level threshold ONi. The i-th on-comparator Hii sends a result of the comparison to a J input terminal of JK flip-flop FFdi of counter 16.

An i-th off-comparator Loi compares shunt command value SP with an i-th off-level threshold OFFi. The i-th off-comparator Loi outputs "1" when the i-th off-level threshold OFFi is greater than shunt command value SP and outputs "0" when the i-th off-level threshold OFFi is smaller than shunt command value SP. The i-th off-comparator Loi sends a result of the comparison to a K input terminal of JK flip-flop FFdi of counter 16.

An i-th JK flip-flop FFdi includes a J input terminal that receives an output from the i-th on-comparator Hii and a K input terminal that receives an output from the i-th off-comparator Loi.

An output xi of the i-th JK flip-flop FFdi is sent to adder 15.

Adder 15 adds outputs x1 to xn of JK flip-flops FFd1 to FFdn together and sends an addition value as switch-on count MLPWM to driving determiner 410 and offset generator 11.

Figure 17:
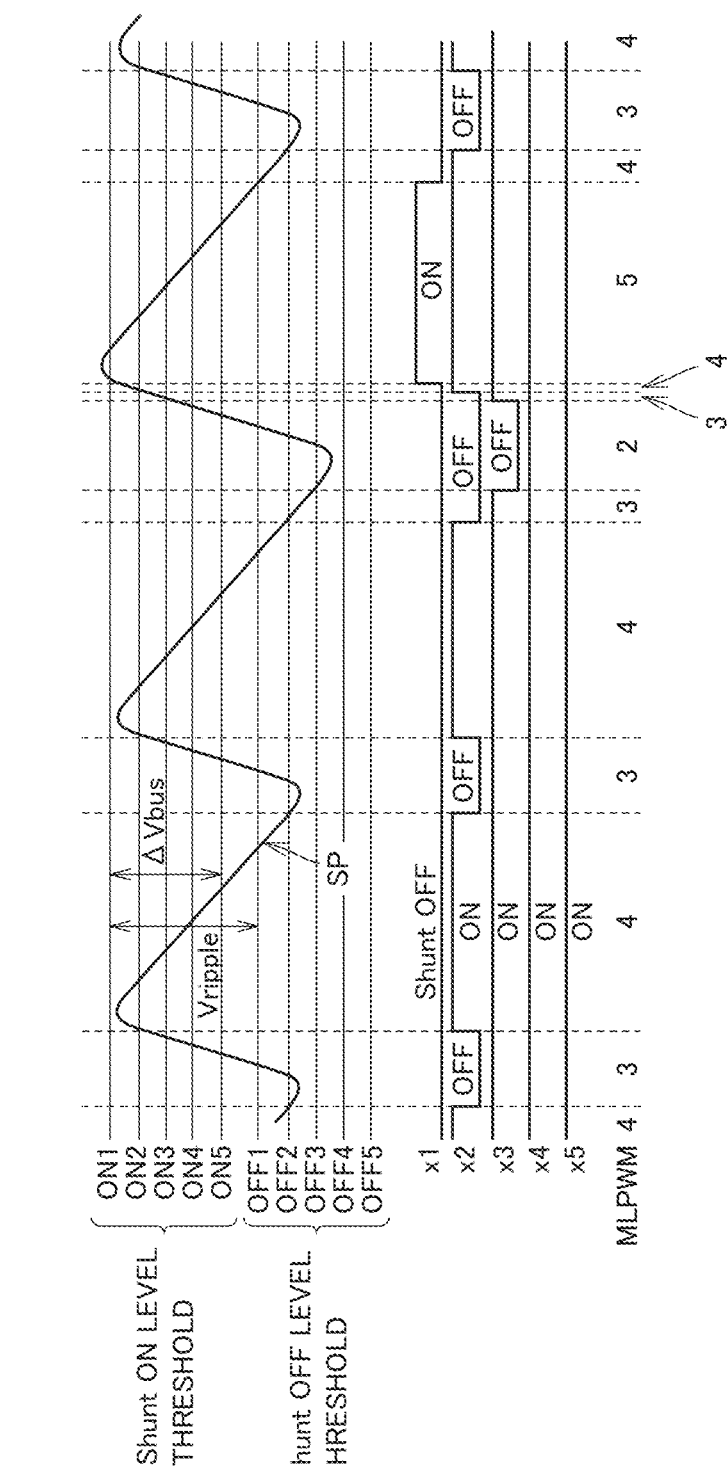
FIG. 17 is a timing chart showing time changes of a shunt command value SP, outputs x1 to xn of JK flip-flops FFd1 to FFdn, and a switch-on count MLPWM.

FIG. 17 is a timing chart showing time changes of shunt command value SP, outputs x1 to xn of JK flip-flops FFd1 to FFdn, and switch-on count MLPWM. FIG. 17 also shows on-level thresholds ON1 to ONn and off-level thresholds OFF1 to OFFn. The number of stages n of DC power supplies I1 to In is 5 for ease of explanation.

Herein, shunt command value SP is expressed by Equation (13) as a signal indicating an error from target control value Vref in relation to bus voltage Vbus.

$$SP = (V\text{bus} - V\text{ref}) \times A \qquad (13)$$

In Equation (12), A is a value indicating an amplification degree of operation processing unit 3A and is set as an amplification degree with appropriate frequency characteristics, and A is 1 here for ease of explanation. This is because the relation between on-level thresholds ON1 to ON5 and off-level thresholds OFF1 to OFF5, and shunt command value SP is normalized for description.

In the relation between on-level thresholds ON1 to ON5 and off-level thresholds OFF1 to OFF5, and shunt command value SP, for example, switch elements S1, S2 are opened (off state) when shunt command value SP falls below off-level thresholds OFF1, OFF2. Switch elements S2 to S5 are shunted (on state) when shunt command value SP exceeds on-level thresholds ON2 to ON5.

In other words, on-level thresholds ON1 to ONn and off-level thresholds OFF1 to OFFn are set as thresholds with hystereses that determine on and off of switch elements Si to Sn relative to shunt command value SP.

In this operation, the setting range of on-level thresholds ON1 to ONn or the setting range of off-level thresholds OFF1 to OFFn is a control voltage fluctuation range ΔVbus of bus voltage Vbus. A difference between on-level threshold ONi (i=1 to n) and off-level threshold OFFi (i=1 to n) is a ripple voltage Vripple of bus voltage Vbus.

In this operation, bus voltage Vbus fluctuates dependent on a solar battery generation current Istr per stage, bus capacitor Cbus, and load current Iload. This causes shunt command value SP to increase and decrease between on-level thresholds ON1 to ONn and off-level thresholds OFF1 to OFFn. A time change ratio of bus voltage Vbusdv/dt is expressed by Equation (14).

$$dV/dt = \{I\text{str} \times (n - \text{MLPWM}) - I\text{load}\}/C\text{bus} \qquad (14)$$

The value of switch-on count MLPWM changes every time shunt command value SP crosses on-level thresholds ON1 to ONn and off-level thresholds OFF1 to OFFn.

Specifically, when shunt command value SP falls below off-level threshold OFFi with xi being ON(=1), xi is OFF (=0). When shunt command value SP exceeds on-level threshold ONi with xi being OFF (=0), xi is ON(=1). This changes switch-on count MLPWM. Thus, the bus voltage is controlled while switching ON/OFF of switch elements Si to Sn in turn.

Power controller 1 controls a bus voltage such that bus voltage Vbus falls within the range of a defined control voltage fluctuation range ΔVbus, accompanied by ripple voltage Vripple, while dissipating heat generated through switching of switch elements Si to Sn.

In the present embodiment, the above operation causes the switching cycles of switch elements Si to Sn to change depending on the state of load 5. A minimum cycle Tmin in the state in which the switching cycle continues steadily is expressed by Equation (15).

$$T\text{min} = 4 \times C\text{bus} \times V\text{ripple}/I\text{str} \qquad (15)$$

According to Equation (15), thus, minimum cycle Tmin that can be continued steadily can be set within an allowable range of heat generation of switch elements Si to Sn by selecting a related constant and designing power controller 1.

When load current Iload changes greatly in a transient manner, dv/dt is larger in the positive or negative direction according to Equation (14). Consequently, a switching interval of switch elements Si to Sn is shorter, resulting in a more rapid bus voltage control response to sharp load fluctuations. This can prevent large fluctuations of bus voltage in a transient manner.

The above principle stabilizes a bus voltage relative to rapid load fluctuations without increasing heat generation by switching of each switch element during steady operation.

As described above, in the power controller according to the present embodiment, the comparator compares as many on-level thresholds and off-level thresholds as the shunt stage count, each of which has a hysteresis relative to a fluctuation range of a bus voltage, with the bus voltage, the flip-flop latches a result of the comparison, and the counter adds up the comparison results, thereby calculating a switch-on count MLPWM.

During steady loading, thus, the switching cycle is restricted to an appropriate range, and heat generation by switching of a switch element does not increase.

During transient load fluctuations, switching intervals are shorter, and a control response can be made also to rapid load fluctuations, thus preventing transient occurrence of large bus voltage fluctuations. Consequently, a power controller with an excellent power quality can be provided without hindering a power controller from having a smaller size and a lighter weight.

Variation of Embodiment 2

The present variation relates to a case where signal generator 4 is configured by an integrated circuit or software.

Figure 18:
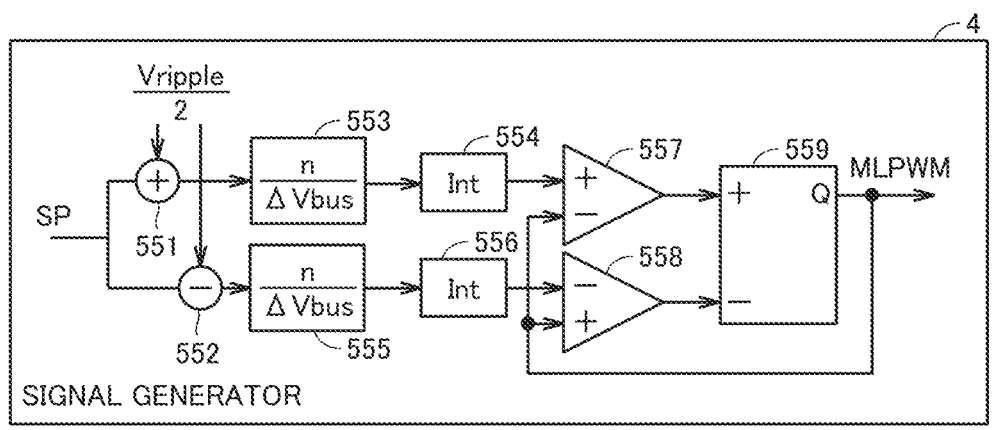
FIG. 18 is a block diagram showing a part of an internal configuration of a signal generator 4 of a power controller 1 according to a variation of Embodiment 2.

FIG. 18 is a block diagram showing a part of an internal configuration of signal generator 4 of power controller 1 according to the variation of Embodiment 2.

Signal generator 4 includes an adder 551, a subtractor 552, a multiplier 553, a multiplier 555, an integer formatting unit 554, an integer formatting unit 556, a comparator 557, a comparator 558, and a counter 559.

Adder 551 adds shunt command value SP and Vrippe/2 together.

Subtractor 552 subtracts Vrippe/2 from shunt command value SP.

Multiplier 553 multiplies an output from adder 551 by n/ΔVbus.

Multiplier 555 multiples an output from subtractor 552 by n/ΔVbus.

Integer formatting unit 554 outputs an integral part of an output from multiplier 553.

Integer formatting unit 556 outputs an integral part of an output from multiplier 555.

Comparator 557 compares an output from integer formatting unit 554 with switch-on count MLPWM. Comparator 557 outputs "1" when the output from integer formatting unit 554 is greater than switch-on count MLPWM. Comparator 557 outputs "0" when the output from integer formatting unit 554 is smaller than switch-on count MLPWM.

Comparator 558 compares an output from integer formatting unit 556 with switch-on count MLPWM. Comparator 558 outputs "0" when the output from integer formatting unit 556 is greater than switch-on count MLPWM. Comparator 558 outputs "1" when the output from integer formatting unit 554 is smaller than switch-on count MLPWM.

Counter 559 increments a count value by an output from comparator 557 and decrements the count value by an output from comparator 558. Counter 559 outputs switch-on count MLPWM as the count value.

The present variation can replace the above operation in which thresholds and comparators required for the shunt stage count with an operation in which thresholds and comparators are not dependent on the stage count, leading to a simplified operation.

Variation

The present invention is not limited to the above embodiments and includes, for example, the following variations.

(1) Although Embodiments 1 and 2 have described the method of controlling bus voltage Vbus to a certain target value, the present invention is applicable to a power controller in any other form.

Figure 19:
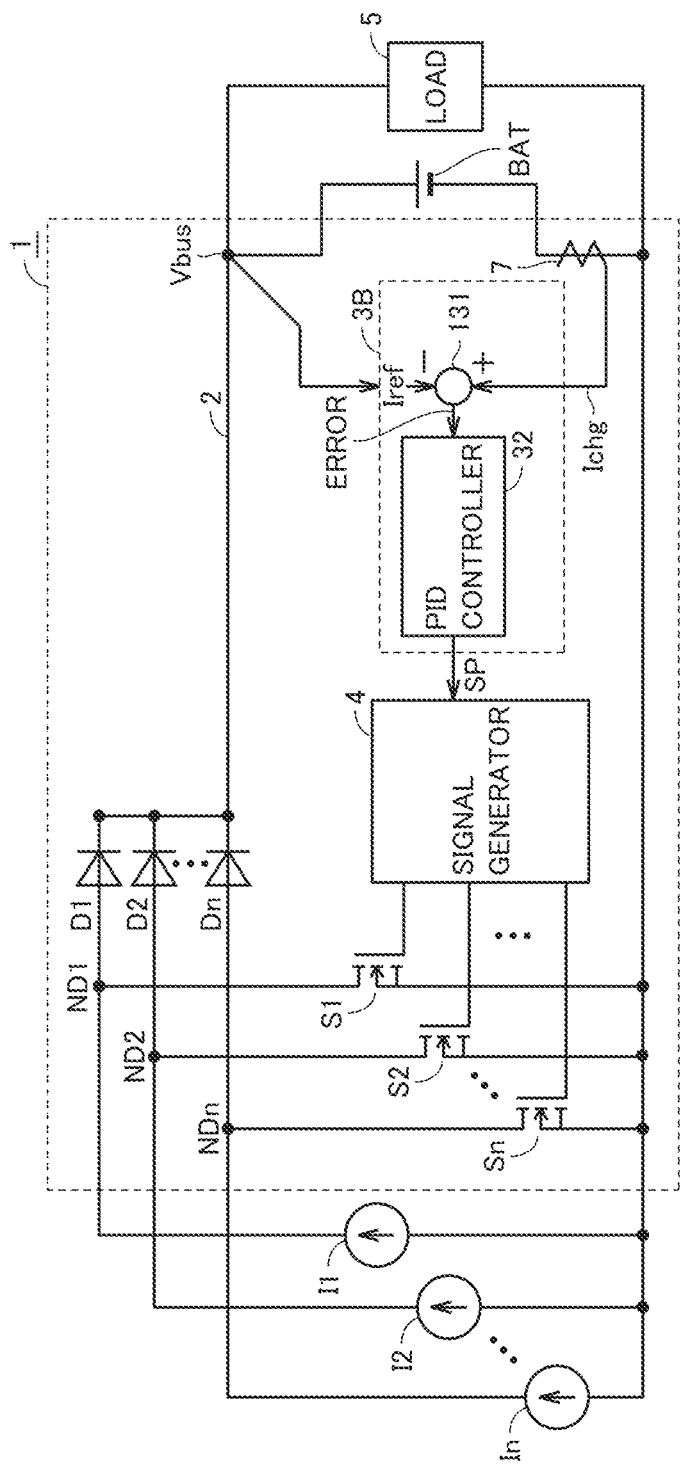
FIG. 19 shows a power controller of the variation

FIG. 19 shows a power controller of a variation.

In this power controller, a battery BAT is directly connected to power bus 2. Although power controller 1 according to Embodiment 1, 2 controls bus voltage Vbus at a certain voltage, power controller 1 shown in FIG. 19 controls a charging current Ichg of battery BAT at a certain current.

A subtractor 131 of an operation processing unit 3B of the power controller of FIG. 19 calculates a difference between charging current Ichg, detected by current detector 14, and current command value Iref and calculates deviation Error. Deviation Error is expressed by Equation (16).

$$\text{Error} = Ichg - Iref \quad (16)$$

The components of operation processing unit 3B of the power controller shown in FIG. 19 except for subtractor 131 can be components similar to those of Embodiment 1 or 2. The power controller of FIG. 19 can control a charging current of a battery to be constant in accordance with the manner described in the above embodiments. Thus, the power controller can be mounted in, for example, a satellite employing a bus directly connected to a battery and used as a power controller that controls an amount of electric power supplied from a solar battery.

Figure 20:
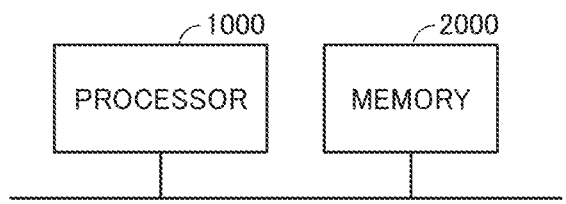
FIG. 20 shows a configuration of a power controller when functions of an operation processing unit 3A and signal generator 4 are implemented using software.

(2) Corresponding operations of operation processing unit 3A and signal generator 4 described in Embodiments 1 and 2 may be configured by hardware or software of a digital circuit. When the functions of operation processing unit 3A and signal generator 4 are implemented using software, the power controller includes, for example, a processor 1000 and a memory 2000 as shown in FIG. 20 and can cause processor 1000 to execute a program stored in memory 2000.

(3) Although the term of Vbus is positive and the target value is negative in Equation (1) of a deviation used for describing Embodiment 1, the target value may be positive and the term of Vbus may be negative, and the signs of the subsequent equations may be inverted.

(4) Although described here as an example of Equation (2) for the shunt amount which is an amount of operation is PID control using a value obtained by performing proportional, integral, and derivative operations on the difference between battery charging current Ichg and the current command value, the operation amount and the equation may be replaced with any other operation amount and any other equation that can increase an amount of current to be shunted as battery charging current Ichg increases.

(5) Although FIG. 8 shows an example in which a logic circuit is used as a specific implementation means for obtaining a difference $\Delta P_W$ of on-pulse width and shunt amount NDUTY_C, a desired result can be obtained by a circuit using an analog time constant or any other method such as an operation using software.

(6) Although the values of coefficients C_tm and C_Norm of FIG. 8 are expressed by Equations (8) to (12), a correction value may be further added in accordance with the actual characteristics of an apparatus.

(7) Although carrier wave cw1 generated by carrier wave generator 401 is a sawtooth wave in the timing chart shown in FIG. 5 for ease of explanation, an inverse sawtooth wave or a triangular wave of any appropriate duty ratio may be used.

(8) Although described here is an example in which signal generator 4 superimposes an offset on common carrier wave cw1 using carrier wave generator 401 and offset superimposing unit 402, signal generator 4 may be configured to individually generate carrier waves with different offsets or reduce an offset from an amount of operation. Although signal generator 4 in the present embodiment has been described by taking, as an example, the case in which the number of a switch element serving as a starting point is increased as the switch-on count decreases, similar effects can be achieved even by a manner in which the number of a switch element serving as a starting point is decreased as the switch-on count increases.

It is to be understood that the embodiments disclosed herein are presented for the purpose of illustration and non-restrictive in every respect. It is therefore intended that the scope of the present invention is defined by claims, not only by the embodiments described above, and encompasses all modifications and variations equivalent in meaning and scope to the claims.

REFERENCE SIGNS LIST 1 power controller; 2 power bus; 3A, 3B operation processing unit; 4 signal generator; 5 load; 7 sampling unit;

8 timing signal generator; 9 corrector; 10 modulator; 11 offset generator; 12 overvoltage detector; 13 correction value operation unit; 14 current detector; 15, 405, 551 adder; 16 counter; 17 comparator; 31, 131, 552, Sub1, Sub2 subtractor; 32 PID controller; 401 carrier wave generator; 402 offset superimposing unit; 403, 557, 558, CmpH, CmpL, Hi1 to Hin, Lo1 to Lon comparator; 406 divider; 409 drive signal assignment unit; 410 driving determiner; 411-1 to 411-n determiner; 553, 555, Mull multiplier; 554, 556 integer formatting unit; 1000 processor; 2000 memory; BAT battery; D1 to Dn diode (backflow prevention element); I1 to In DC power supply; S1 to Sn switch element; SL selector; CT1, CT2, 559 counter; FF1, FF2, FF3 flip-flop; JK, FFd1 to FFdn JK flip-flop; NOR NOR circuit; ND1, ND2 NAND circuit.

The invention claimed is:

1. A power controller connected to a plurality of power supplies and a load, the power controller comprising:
a plurality of switch elements provided corresponding one-to-one to the plurality of power supplies, each of the plurality of switch elements switching on or off to switch between supplying electric power from a corresponding one of the plurality of power supplies to the load and stopping the supply;
an operation processing circuit to compute an amount of operation for adjusting the electric power supplied to the load; and
a signal generator, wherein
the signal generator includes
a correction value operation unit to obtain a correction value based on a difference of an on-pulse width between a shunt current flowing through a corresponding one of the plurality of switch elements and a shunt drive signal for driving the corresponding one of the plurality of switch elements, and
a corrector to correct, based on the correction value, an amount of operation output from the operation processing circuit and output the corrected amount of operation,
the signal generator computes, based on the corrected amount of operation, a number of switch elements to be turned on among the plurality of switch elements and a duty ratio set to the number of switch elements to be turned on and generate, based on the determined number of switch elements and the determined duty ratio, a signal for driving at least one of the plurality of switch elements,
different numbers are individually are assigned to the plurality of switch elements,
the signal generator selects a switch element to be a starting point among the plurality of switch elements,
the signal generator determines, based on the number of switch elements to be turned on, the switch elements to be turned on in order of the numbers assigned to the plurality of switch elements from the switch element to be the starting point, and changes a switch element to be the starting point when the number of switch elements decreases, and
the signal generator includes an overvoltage detector to output an overvoltage detection signal when a fluctuation range of a voltage supplied to the load exceeds a predetermined fluctuation range.

2. The power controller according to claim 1, wherein the signal generator divides the corrected amount of operation into an integral part and a fractional part, compares the fractional part with a carrier wave to generate a fractional part PWM signal, and adds the integral part and the fractional part PWM signal together to obtain the number of switch elements to be turned on and the duty ratio set to the number of switch elements to be turned.

3. The power controller according to claim 2, wherein
the signal generator includes a timing signal generator to generate a timing signal for setting a control cycle that is a cycle in which the corrected amount of operation is generated,
the timing signal generator sets the control cycle to a first length in a stationary state, and
upon detection of fluctuations of the load, the signal generator enters a transient response state and sets the control cycle to a second length shorter than the first length.

4. The power controller according to claim 3, wherein the correction value operation unit uses a predetermined value as the difference of the on-pulse width.

5. The power controller according to claim 3, wherein the correction value operation unit calculates the difference of the on-pulse width based on the shunt current flowing through the corresponding one of the plurality of switch elements.

6. The power controller according to claim 5, wherein
the correction value operation unit includes a multiplier to multiply the difference of the on-pulse width by a first coefficient to calculate the correction value in the stationary state, and
multiply the difference of the on-pulse width by a second coefficient to calculate the correction value in the transient response state, and
the first coefficient is a value obtained by dividing a total number of the plurality of switch elements by the first length, and the second coefficient is a value obtained by dividing the total number of the plurality of switch elements by the second length.

7. The power controller according to claim 5, wherein
the correction value operation unit includes a multiplier to multiply the difference of the on-pulse width by a first coefficient to calculate the correction value in the stationary state, and
multiply the difference of the on-pulse width by a second coefficient to calculate the correction value in the transient response state, and
the first coefficient is zero, and the second coefficient is a value obtained by subtracting a value obtained by dividing a total number of the plurality of switch elements by the first length from a value obtained by dividing the total number of the plurality of switch elements by the second length.

8. The power controller according to claim 6, wherein the corrector subtracts the correction value from the amount of operation output from the operation processing circuit to correct the amount of operation, and outputs the corrected amount of operation.

9. The power controller according to claim 5, comprising:
a first comparator to compare a differential detection signal with a first reference value and output a result of the comparison as an on-timing signal of the shunt current, the differential detection signal having a differentiated waveform of the shunt current;
a second comparator to compare the differential detection signal with a second reference value and output a result of the comparison as an off-timing signal of the shunt current; and
a J-K flip-flop including a J input terminal to receive the on-timing signal of the shunt current and a K input terminal to receive the off-timing signal of the shunt current, the J-K flip-flop generating a shunt current synchronization signal.

10. The power controller according to claim 9, comprising:
   a first counter to count a pulse number of a clock signal during an ON period of the shunt drive signal;
   a first flip-flop to hold an output from the first counter to output a count value during the ON period of the shunt drive signal;
   a second counter to count a pulse number of the clock signal during the ON period of the shunt current synchronization signal;
   a second flip-flop to hold an output from the second counter to output a count value during the ON period of the shunt current synchronization signal; and
   a subtractor to subtract a count value during the ON period of the shunt current synchronization signal from a count value during the ON period of the shunt drive signal and output a result of the subtraction.

11. The power controller according to claim 10, comprising:
   a logic circuit to output a timing signal with the overvoltage detection signal being not output, the timing signal indicating a period in which both of the shunt drive signal and the shunt current synchronization signal are OFF; and
   a third flip-flop to hold, in accordance with the timing signal, a difference between the count values output from the subtractor to generate the difference of the on-pulse width.

12. A power controller connected to a plurality of power supplies and a load, the power controller comprising:
   a plurality of switch elements provided corresponding one-to-one to the plurality of power supplies, each of the plurality of switch elements switching on or off to switch between supplying electric power from a corresponding one of the plurality of power supplies to the load and stopping the supply;
   an operation processing circuit to compute an amount of operation for adjusting the electric power supplied to the load; and
   a signal generator, wherein the signal generator includes
   a comparator to compare first to n-th on-level thresholds and first to n-th off-level thresholds with the amount of operation, the first to n-th on-level thresholds being assigned within a variable range of the amount of operation, the first to n-th off-level thresholds being assigned to have a hysteresis corresponding one-to-one to the first to n-th on-level thresholds, and
   a counter to determine, based on a result of the comparison by the comparator, the number of switch elements to be turned on.

13. The power controller according to claim 12, wherein the comparator includes
   n number of first to n-th on-comparators, and
   n number of first to n-th off-comparators,
   an i-th on-comparator outputs "1" when the amount of operation is greater than an i-th on-level threshold and outputs "0" when the amount of operation is smaller than the i-th on-level threshold, and
   an i-th off-comparator outputs "1" when an i-th off-level threshold is greater than the amount of operation and outputs "0" when the i-th off-level threshold is smaller than the amount of operation.

14. The power controller according to claim 13, wherein the counter includes
   n number of first to n-th JK flip-flops, and
   an adder to add up outputs from the first to n-th JK flip-flops, and
   an i-th JK flip-flop includes
      a J input terminal to receive an output from the i-th on-comparator, and
      a K input terminal to receive an output from the i-th off-comparator.

15. The power controller according to claim 7, wherein the corrector subtracts the correction value from the amount of operation output from the operation processing circuit to correct the amount of operation, and outputs the corrected amount of operation.

\* \* \* \* \*